United States Patent [19]
Nishimura et al.

[11] Patent Number: 5,829,087
[45] Date of Patent: Nov. 3, 1998

[54] SUBSTRATE SPIN CLEANING APPARATUS

[75] Inventors: Joichi Nishimura; Tadashi Sasaki; Masami Ohtani, all of Kyoto, Japan

[73] Assignee: Dainippon Screen Mfg. Co., Ltd., Kyoto, Japan

[21] Appl. No.: 529,832

[22] Filed: Sep. 18, 1995

[30] Foreign Application Priority Data

| | | | | |
|---|---|---|---|---|
| Sep. 20, 1994 | [JP] | Japan | ................................ | 6-252961 |
| Feb. 22, 1995 | [JP] | Japan | ................................ | 7-059837 |
| Mar. 9, 1995 | [JP] | Japan | ................................ | 7-079583 |
| Apr. 17, 1995 | [JP] | Japan | ................................ | 7-116380 |

[51] Int. Cl.$^6$ .................................................. A46B 13/04
[52] U.S. Cl. .............................. 15/88.2; 15/21.1; 15/77; 15/102
[58] Field of Search ................................ 15/21.1, 88.2, 15/77, 102, 88.3, 302, 97.1

[56] References Cited

U.S. PATENT DOCUMENTS

| | | | |
|---|---|---|---|
| 4,993,096 | 2/1991 | D'Amato | 15/21.1 |
| 5,351,360 | 10/1994 | Suzuki et al. | 15/77 |
| 5,475,889 | 12/1995 | Thrasher et al. | 15/77 |
| 5,636,401 | 6/1997 | Yonemizu et al. | 15/21.1 |
| 5,685,039 | 11/1997 | Hamada et al. | 15/21.1 |

FOREIGN PATENT DOCUMENTS

| | | |
|---|---|---|
| 102024 | 6/1982 | Japan . |
| 182234 | 10/1983 | Japan . |
| 112625 | 6/1984 | Japan . |
| 193029 | 11/1984 | Japan . |
| 1-107129 | 7/1989 | Japan . |
| 3-52228 | 3/1991 | Japan . |

*Primary Examiner*—Gary K. Graham
*Attorney, Agent, or Firm*—Ostrolenk, Faber, Gerb & Soffen, LLP

[57] ABSTRACT

A cleaning brush is fixed to a cleaner support that is mounted to a rotary element for vertical movement with respect thereto. The rotary element is rotatably supported by a forward portion of a support arm that is pivotable about a vertical axis at the rear of the support arm. A closed space defined by a bellows is connected to air piping having a pressure gauge and a regulator. The regulator is operable in response to variations of pressure resulting from engagement of the cleaning brush with a substrate, to control pressure within said bellows whereby the latter expands and contracts to raise or lower the cleaner support relative to the substrate as required to maintain the pressure in a predetermined range. The aforesaid construction responds fast enough to allow the cleaning brush to follow warping of the substrate with facility, and by so doing clean an entire substrate surface uniformly.

17 Claims, 16 Drawing Sheets

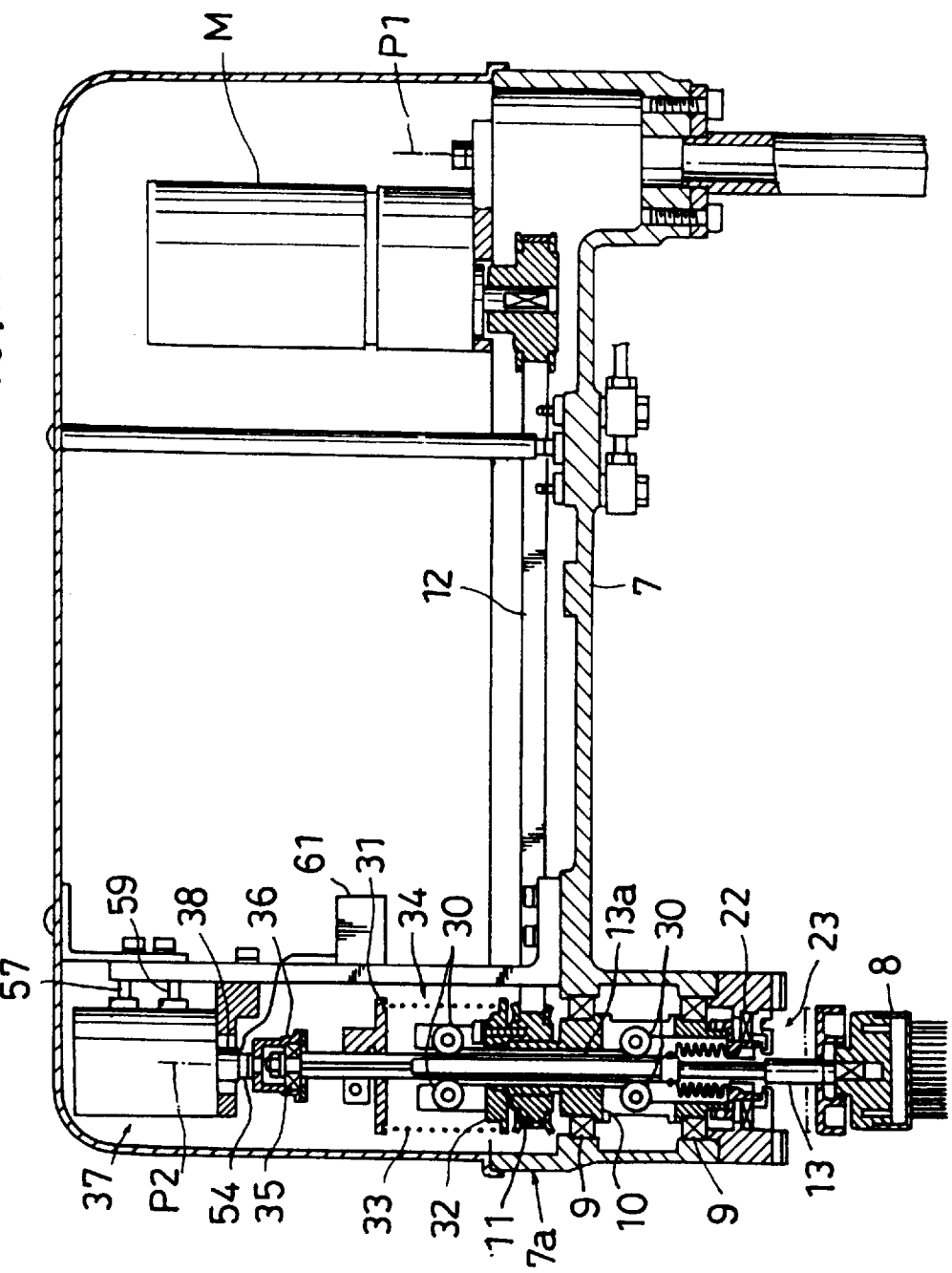

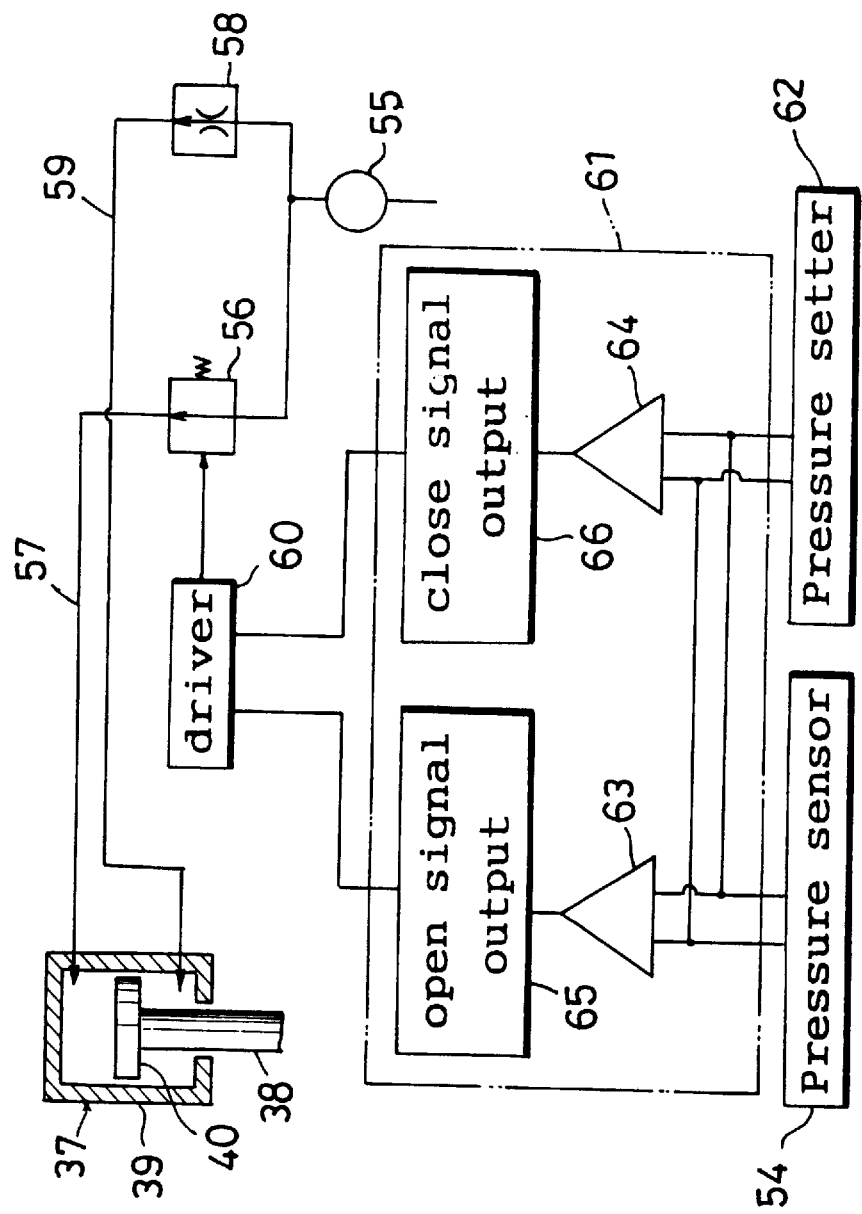

SUBSTRATE SPIN CLEANING APPARATUS

BACKGROUND OF THE INVENTION (1) Field of the Invention

The present invention relates to substrate spin cleaning apparatus for cleaning semiconductor wafers, glass substrates for photomasks, glass substrates for liquid crystal displays, substrates for optical disks or the like, by supplying a cleaning liquid such as deionized water. Such an apparatus includes a substrate supporting device for supporting a substrate to be rotatable about a vertical axis, a cleaning device for cleaning a surface of the substrate, a rotating device for rotating the cleaning device about a vertical axis, a displacing device for displacing the cleaning device horizontally over the substrate surface, and a cleaning liquid supplying device for supplying a cleaning liquid to the substrate surface being cleaned by the cleaning device.

(2) Description of the Related Art

Conventional substrate spin cleaning apparatus are disclosed in Japanese Utility Model Publication (Unexamined) No. 1-107129 and Japanese Patent Publication (Unexamined) No. 3-52228, for example. In these conventional apparatus, a cleaning liquid is supplied to the surface of a substrate being spun about a vertical axis, a rotating cleaning device (e.g. a cleaning or scrubbing brush) is moved over the substrate surface. The cleaning device contacts the substrate under a predetermined pressure to remove particles and impurities from the substrate surface. The particles and impurities removed are caused to flow with the cleaning liquid outwardly of the substrate by the centrifugal force due to the spin of the substrate.

To displace the cleaning device horizontally over the substrate surface, an arm having the cleaning device and a motor for rotating the cleaning device is rigidly attached to a support shaft rotatable about a vertical axis. A motor or the like is operatively connected to the latter shaft to rotate the support, thereby to displace the cleaning device horizontally over the substrate surface.

The support shaft is vertically movable to move the cleaning device, in combination with the vertical movement of the support shaft, between a position for cleaning the substrate and a position upward therefrom and between a cleaning position on the substrate and a retracted position displaced from the substrate. Further, the vertical movement of the support shaft is utilized to set the cleaning device relative to the substrate.

In the conventional apparatus, however, the cleaning device in the cleaning position is set to a fixed height, and the pressure applied from the cleaning device to the substrate is determined by initial setting once and for all. On the other hand, the substrate often becomes warped, under its own weight and influences of heat treatment such as cooling or heating, to produce a level difference in the order of 0.5 mm. Consequently, a difference occurs in the pressure applied from the cleaning device to the substrate between an upwardly curved portion and a downwardly curved portion of the substrate. This results in a non-uniformity in cleaning performance for the substrate surface.

For causing the cleaning device to follow the warp of the substrate, the conventional apparatus noted above would vertically move the support shaft to raise and lower the cleaning device. However, such a control would involve raising and lowering of the weight of the support shaft, arm and motor in addition to the cleaning device. With a large weight accompanying the vertical movement, difficulties inevitably arise in the warp-following control.

In addition cleaning performance tends not to be uniform because of dimensional errors or variations of the cleaning device or variations in attachment occurring with replacement of the cleaning device.

SUMMARY OF THE INVENTION

An object of the present invention is to provide a substrate spin cleaning apparatus which causes a cleaning device to follow warping of a substrate with facility, thereby cleaning the entire surface of the substrate uniformly.

Another object of the invention is to provide a simple construction to set a pressure applied to a substrate reliably with a small force.

Yet another object of the invention is to improve cleaning performance by pressing a cleaning device evenly upon a substrate.

A further object of the invention is to detect with precision a pressure applied to a substrate, thereby enabling precise setting and adjustment of the pressure.

A still further object of the invention is to detect with precision a reaction imparted from a substrate to a cleaning device, thereby causing the cleaning device to follow warping of the substrate reliably for uniform cleaning of the entire substrate surface.

A still further object of the invention is to enhance cleaning performance by causing a cleaning device to follow warping of a substrate quickly.

A still further object of the invention is to provide for reliable, long-term prevention of contamination of substrates due to particles produced from bearings.

Other objects of the invention will be apparent from the description of the preferred embodiments.

The above objects are fulfilled, according to the present invention, by a substrate spin cleaning apparatus comprising a substrate supporting device for supporting a substrate and spinning the substrate about a first vertical axis; a cleaning device for cleaning a surface of the substrate; a cleaner rotating device for rotating the cleaning device about a second vertical axis; a cleaner displacing device for displacing the cleaning device horizontally over the surface of the substrate; and a cleaning liquid supplying device for supplying a cleaning liquid to positions of the surface of the substrate under cleaning treatment by the cleaning device; wherein the cleaning device is supported by the cleaner displacing device to be vertically movable relative thereto through a pressurizing device.

According to the present invention, the cleaning device is movable relative to the cleaner displacing device while the pressurizing device applies a predetermined pressure to the substrate. This allows the cleaning device to follow surface unevenness resulting from warping of the substrate.

Thus, the cleaning device is vertically movable relative to the cleaner displacing device to follow warping of the substrate. The vertical movement of the cleaning device involves a smaller inertial mass than when the cleaning device moves vertically with the cleaner displacing device. This feature allows the cleaning device to follow warping of the substrate with facility to clean an entire substrate surface uniformly.

The pressurizing device may include a pressure applying mechanism for adjustably determining a pressing force of the pressurizing device. A weight balancing device may be provided for balancing the weight of the cleaning device. Then, the pressure applied to the substrate is set reliably with a small force.

The center of a force for supporting the cleaning device by the weight balancing device to balance the weight of the cleaning device, and the center of a force applied from the pressure applying mechanism to the cleaning device to press the cleaning device upon the substrate, may coincide with the center of rotation of the cleaning device. Then, the supporting force of the weight balancing device for supporting the cleaning device, and the force applied from the pressure applying mechanism to the cleaning device, are operative without deviating from the cleaning device in rotation. Consequently, the entire working surface of the cleaning device is evenly pressed upon the substrate to promote high cleaning performance.

The apparatus may further comprise sensor for detecting pressure applied from the cleaning device to the substrate, in order to set a pressure applied from the pressure applying mechanism to the substrate. The sensor may detect the pressure having a center thereof coinciding with the center of rotation of the cleaning device. The pressure applied to the substrate may thereby be detected with high precision, to enable setting and adjustment of the pressure with high precision.

The substrate spin cleaning apparatus according to the present invention may comprise a pressure sensor disposed between the cleaning device and the pressurizing device for detecting pressure applied from the cleaning device to the substrate under cleaning treatment, and a controller for controlling the pressurizing device to maintain the pressure detected by the sensor within a predetermined range.

With this construction, the pressure sensor disposed between the cleaning device and the pressurizing device detects, with high precision, a reaction transmitted from the spinning substrate to the cleaning device, i.e. the pressure applied from the cleaning device to the substrate, rather than the operating pressure of the pressurizing device. Inventors have attempted to detect the operating pressure of the pressurizing device, and control the pressurizing device to maintain the operating pressure at a fixed value. However, it has been found that this attempt gives unsatisfactory results in attempting to follow warping of the substrate. This is considered to result from the fact that with warping of the substrate only slight variations occur in the pressure applied from the cleaning device to the substrate, that the variations transmitted to the pressurizing device tend to be reflected with delay in its operating pressure with, and that, because of a resistance in the construction for vertically moving the cleaning device and for other reasons, an error tends to occur between the operating pressure applied from the pressurizing device and the pressure applied to the substrate.

Based on the above findings, a construction is provided for directly detecting a reaction transmitted from the spinning substrate to the cleaning device, without using the pressurizing device, to detect the pressure applied from the cleaning device to the substrate with high precision. Based on the pressure detected with high precision, the pressure sensor detects directly, without referring to the pressurizing device, a deviation from the predetermined range of the pressure applied from the cleaning device to the substrate due to warping of the substrate. When the pressure detected exceeds the predetermined range, the pressurizing device raises the cleaning device from the substrate. When the pressure detected is below the predetermined range, the pressurizing device lowers the cleaning device toward the substrate. In this way, the pressure applied from the cleaning device to the substrate is maintained within the predetermined range with high precision.

Thus, in response to variations due to warping of the substrate occurring in the pressure applied from the cleaning device to the spinning substrate being cleaned, the pressurizing device moves the cleaning device vertically relative to the substrate, to maintain the pressure applied from the cleaning device to the substrate with a predetermined range. As a result, the cleaning device follows warping of the substrate regardless of the degree of warping, to clean the entire substrate surface uniformly while constantly applying the predetermined pressure thereto.

The pressurizing device may comprise a linear actuator which responds quickly variations in the pressure applied from the cleaning device to the spinning substrate. As a result, the cleaning device may follow warping of the substrate surface with increased facility to enhance cleaning performance.

In the substrate spin cleaning apparatus according to the present invention, the cleaning device may be supported by a cleaner support. Rotatably supported by the cleaner displacing device through bearings. The cleaner support may have a magnetic fluid seal disposed below the bearings to prevent falling of particles produced from the bearings, and may also have a labyrinth seal to prevent water from entering the magnetic fluid seal.

With this construction, the magnetic fluid seal prevents falling of particles produced from the bearings, and the labyrinth seal prevents entry to the magnetic fluid seal of water in splashes produced during a cleaning treatment.

Consequently, the particles produced from the bearings are effectively prevented from falling on the substrate, and a deterioration of the magnetic fluid seal is checked to enhance its durability. Thus reliable long-term protection against contamination by particles produced from the bearings is provided for substrates that are being treated.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 14 is an enlarged view in vertical section of a principal portion of the sixth embodiment.

FIG. 15 is a block diagram of a control system in the sixth embodiment.

DESCRIPTION OF THE PREFERRED EMBODIMENTS

Preferred embodiments of the present invention will be described hereinafter with reference to the drawings.

(First Embodiment)

Figure 1:
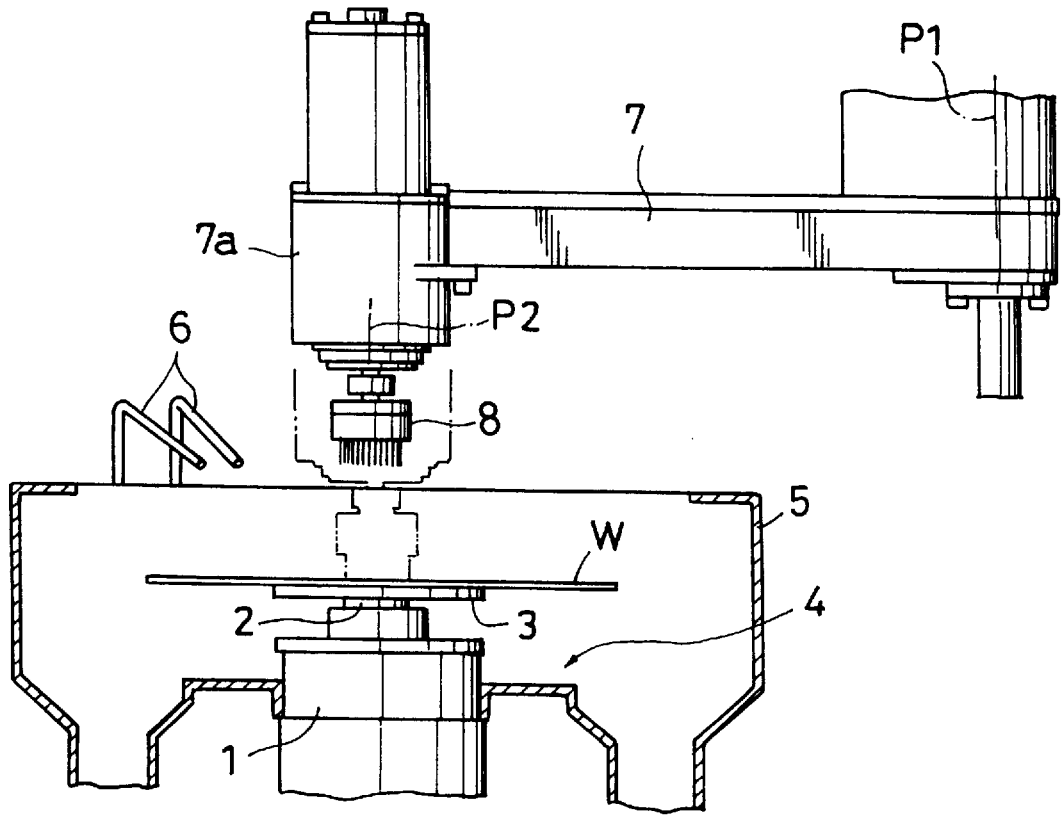
FIG. 1 is a schematic in vertical section of a substrate spin cleaning apparatus constructed according to a first embodiment of the present invention.
Figure 2:
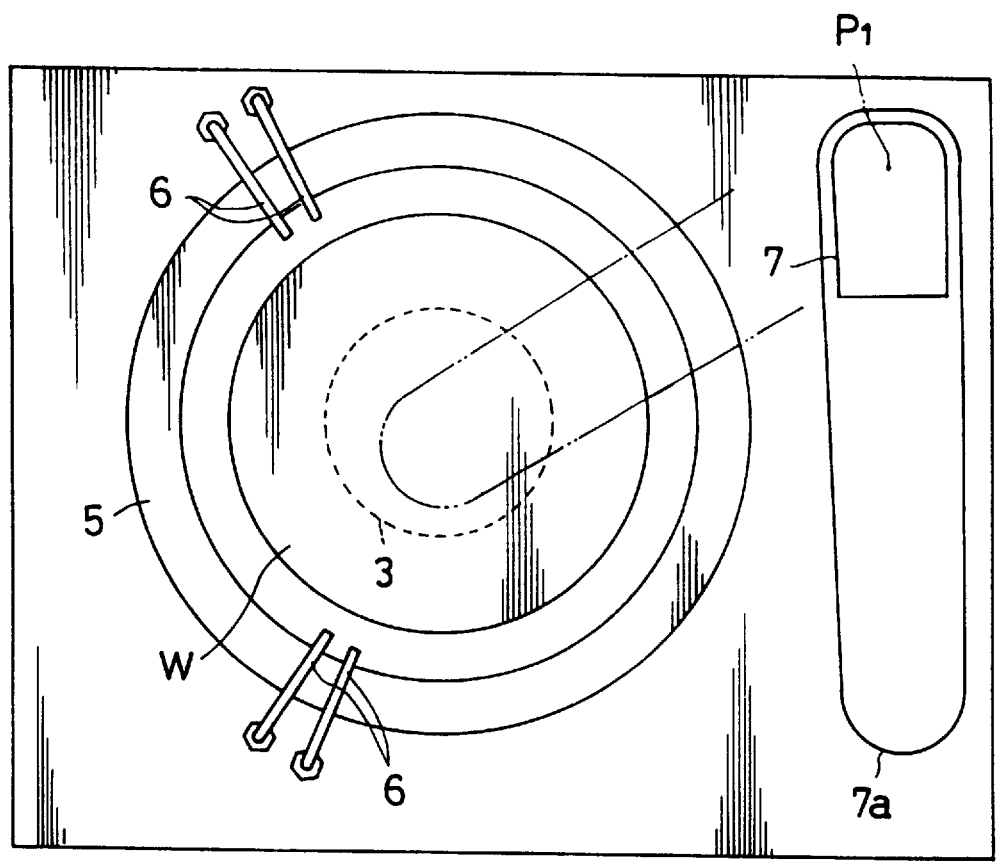
FIG. 2 is a plan view of the apparatus in the first embodiment.
Figure 3:
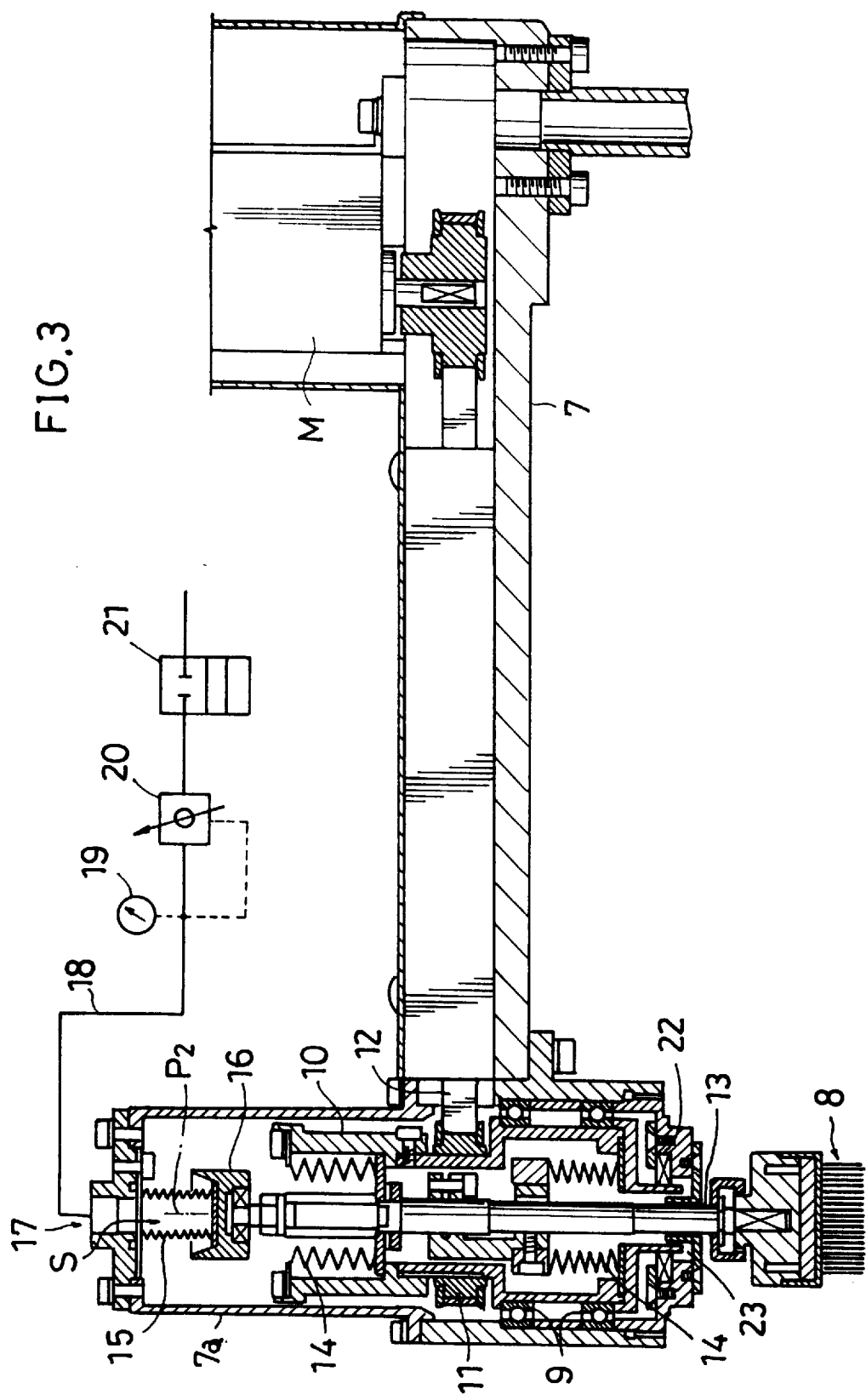
FIG. 3 is an enlarged view in vertical section of a principal portion of the first embodiment.

The apparatus illustrated in FIGS. 1 through 3 includes an electric motor 1 for rotating a rotary shaft 2 about a vertical axis. A turntable 3 is attached to the rotary shaft 2 to be rotatable therewith, while supporting a substrate or wafer W by vacuum suction. These components constitute a substrate supporting device 4 for supporting wafer W and spinning it about the vertical axis.

In this embodiment, the substrate supporting device 4 includes the turntable 3 of the suction-supporting type which, however, is not limitative. For example, the substrate supporting device 4 may include a plurality of substrate supporting elements arranged on the turntable 3 for supporting wafer W at points along its periphery thereof, with positioning pins mounted on the upper ends of the substrate supporting elements for determining a horizontal position of wafer W. In this case, wafer W is supported for spinning movement in a position spaced from the upper surface of the turntable 3.

The substrate supporting device 4 and wafer W supported thereby are surrounded by a cup 5 that is vertically movable by a lift mechanism (not shown). Nozzles 6 are arranged outwardly and circumferentially of the cup 5 to act as a cleaning liquid supplying device for delivering a cleaning liquid such as deionized water toward the center of wafer W.

Further, an angle-shaped support arm 7 is disposed outside the cup 5 to be pivotable about a first vertical axis P1 by an electric motor (not shown). The support arm 7 includes a forward arm portion 7a having a cleaning brush 8 attached to a lower end thereof to be rotatable about a second vertical axis P2 for cleaning the surface of wafer W.

As shown in FIG. 3, the forward arm portion 7a has a hollow rotary element 10 mounted therein through bearings 9 to be rotatable about the second axis P2. The rotary element 10 supports a pulley 11 mounted on a longitudinally intermediate portion thereof to be rotatable together. The pulley 11 is operatively connected through a timing belt 12 to an electric motor M mounted on the support arm 7 adjacent the first axis P1 to act as a cleaner rotating device.

The cleaning brush 8 is rigidly attached to a cleaner support 13 extending through the rotary element 10. The cleaner support 13 is connected to the rotary element 10 to be rotatable together, with a first section of bellows 14 formed of flexible stainless steel extending between an upper position of the cleaner support 13 and an upper end of the rotary element 10 and a second section of bellows 14 extending between a lower position of the cleaner support 13 and a lower end of the rotary element 10.

The forward arm portion 7a further includes a stopper 16 mounted therein and opposed to the upper end of the cleaner support 13. The stopper 16 is connected to the forward arm portion 7a through a second bellows 15 formed of flexible stainless steel. The cleaner support 13 has an upper end thereof fitted in the stopper 16 to be rotatable and vertically movable relative thereto. The forward arm portion 7a, second bellows 15 and stopper 16 in combination define a closed space S. The forward arm portion 7a has a supply/exhaust port 17 formed in an upper end thereof and communicating with the closed space S. The first and second bellows 14 and 15, closed space S and a device for supplying and exhausting air to/from the closed space S constitute a pressurizing device using air as a drive source. The first and second bellows 14 and 15 may be formed of plastic. The forward arm portion 7a, second bellows 15 and stopper 16 defining the closed space S constitute a pressure applying mechanism.

A pressurized air source (not shown) is connected to the supply/exhaust port 17 through air piping 18. The air piping 18 has a pressure gauge 19, a regulator 20 and a switch valve 21 mounted in intermediate positions thereof for automatically maintaining the pressure in the air piping 18 within a predetermined range.

A magnetic fluid seal 22 and a labyrinth 23 are disposed between lower portions of the forward arm portion 7a and rotary element 10. These components particularly seal 22 prevent dust produced by wear of the bearings 9 disposed above seals 22, 23 from falling to the wafer W, and seal 23 prevents the cleaning liquid from entering arm portion 7a and impinging upon seal 22.

The cleaning apparatus having the above construction cleans the surface of wafer W by supplying the cleaning liquid to and pressing the cleaning brush 8 on the wafer surface. If the wafer W is warped, variations occur in the cleaning pressure applied from the cleaning brush 8 to the wafer W with spinning of the wafer W and movement of the cleaning brush 8. For positions of wafer W curved upward, the pressure gauge 19 detects pressures higher than the predetermined range. Then, the regulator 20 is operated to reduce the pressure inside the air piping 18 to the predetermined range, thereby contracting the second bellows 15. As a result, the cleaning brush 8 supported by the cleaner support 13 is raised to maintain the pressure from the cleaning brush 8 to the wafer W within a predetermined range. For positions of wafer W curved downward, the pressure gauge 19 detects pressures lower than the predetermined range. Then, the regulator 20 is operated to increase the pressure inside the air piping 18 to the predetermined range, thereby expanding the second bellows 15. As a result, the cleaning brush 8 supported by the cleaner support 13 is lowered to maintain the pressure from the cleaning brush 8 to the wafer W within the predetermined range.

(Second Embodiment)

Figure 4:
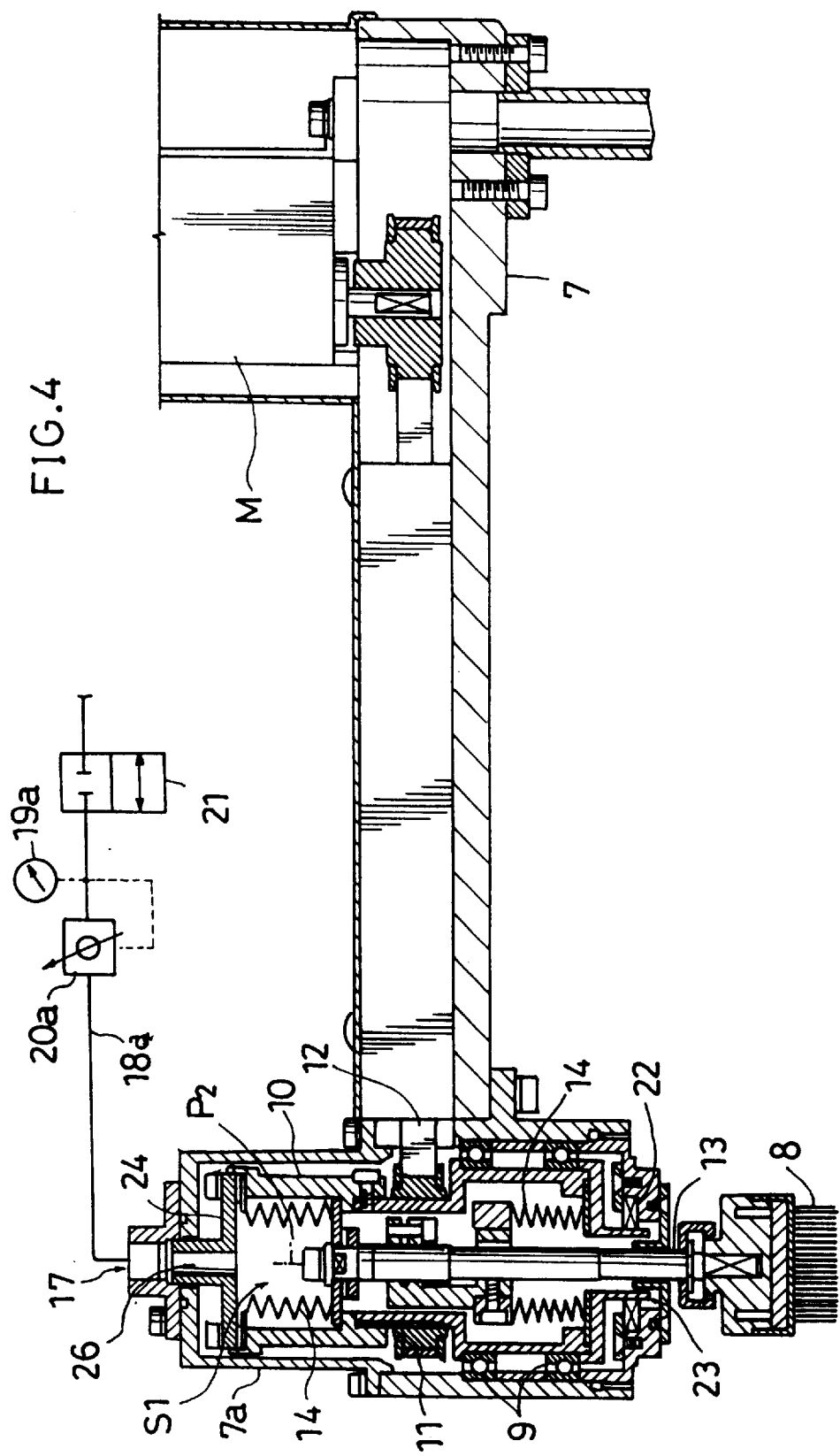
FIG. 4 is an enlarged view in vertical section of a principal portion of substrate spin cleaning apparatus constructed according to a second embodiment of the invention.

This second embodiment (FIG. 4) differs from the first embodiment in the following respects.

The second bellows 15 is omitted from the second embodiment. The upper first bellows 14 has an upper end thereof closed by a lid 24 to define a closed space S1. The lid 24 is rotatably connected to the forward arm portion 7a through a seal 25. The lid 24 includes a bore 26 extending therethrough to communicate the closed space S1 with the supply/exhaust port 17 formed in the forward arm portion 7a. The first bellows 14, closed space S1 and a device for supplying and exhausting air to/from the closed space S1 constitute a pressurizing device using air as a drive source. The upper first bellows 14 and lid 24 defining the closed space S1 constitute a pressure applying mechanism.

A vacuum source (not shown) is connected to the supply/exhaust port 17 through air piping 18a. The air piping 18a has a pressure gauge 19a and a vacuum regulator 20a mounted in intermediate positions thereof for automatically maintaining the pressure in the air piping 18a within a predetermined range. The other details of this embodiment are the same as in the first embodiment, and like reference numerals are used to identify like parts which will not be described again.

According to the second embodiment, when the wafer W is subjected to a pressure exceeding a predetermined pressure owing to the weight of cleaning brush 8 and cleaner support 13, the closed space S1 is decompressed to raise the cleaning brush 8. Thus, part of the above weight is canceled to secure the pressure. When the predetermined pressure exceeds the above weight, the air piping 18a may be connected to a pressurized air source as in the first embodiment.

(Third Embodiment)

Figure 6:
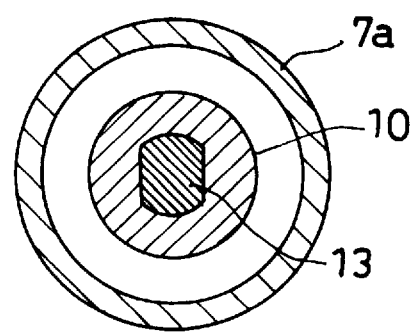
FIG. 6 is a horizontal cross section of a portion of the apparatus shown in FIG. 5.
Figure 5:
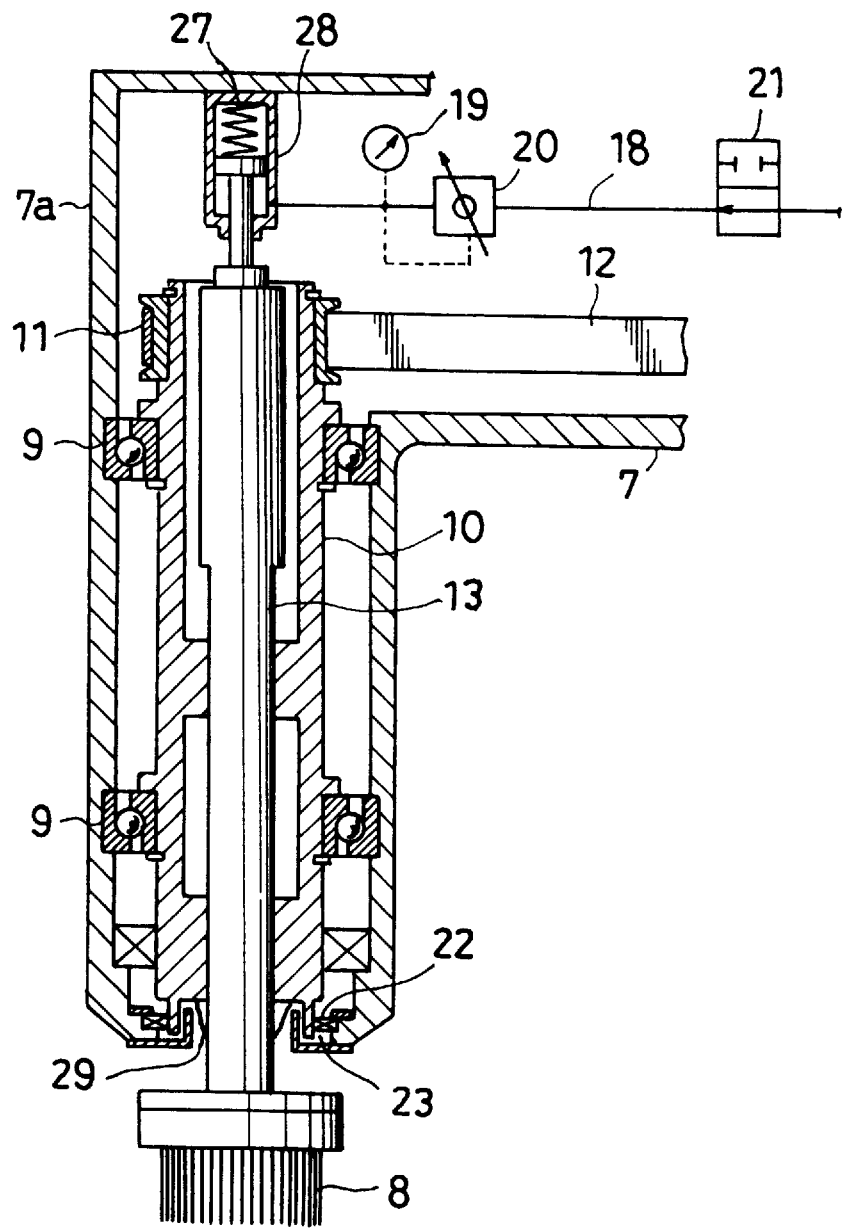
FIG. 5 is an enlarged view in vertical section of a principal portion of substrate spin cleaning apparatus constructed according to a third embodiment.

FIG. 5 is an enlarged view in vertical section of a principal portion of a third embodiment. FIG. 6 is a cross section of a portion thereof. This embodiment differs from the first embodiment in the following respects.

The cleaner support 13 has a or non-circular cross section in a longitudinally intermediate portion thereof. The track-shaped portion allows only vertical movement of the rotary element 10. The cleaner support 13 is connected at the upper end thereof to an upper position of the forward arm portion 7a through a single-acting air cylinder 28. The air cylinder 28 acts as a pressure applying mechanism with a compression coil spring 27 mounted therein for applying a downward pressure to the cleaner support 13. Air piping 18 is connected to the air cylinder 28 to act as a pressurizing device using air as a drive source. A flexible seal 29 is mounted by thermal fusion between lower positions of the rotary element 10 and cleaner support 13, for preventing dust produced by relative sliding movement between the rotary element 10 and cleaner support 13 from falling to the wafer W, and entry of the cleaning liquid. The other details of this embodiment are the same as in the first embodiment, and like reference numerals are used to identify like parts which will not be described again.

The pressure applied from the cleaning brush 8 to the wafer W is maintained in a predetermined range by maintaining the pressure inside the air piping 18 within a predetermined range. In this embodiment, this pressure control operation includes a case of maintaining a pressure at only one predetermined point at a predetermined value having no range.

(Fourth Embodiment)

Figure 7:
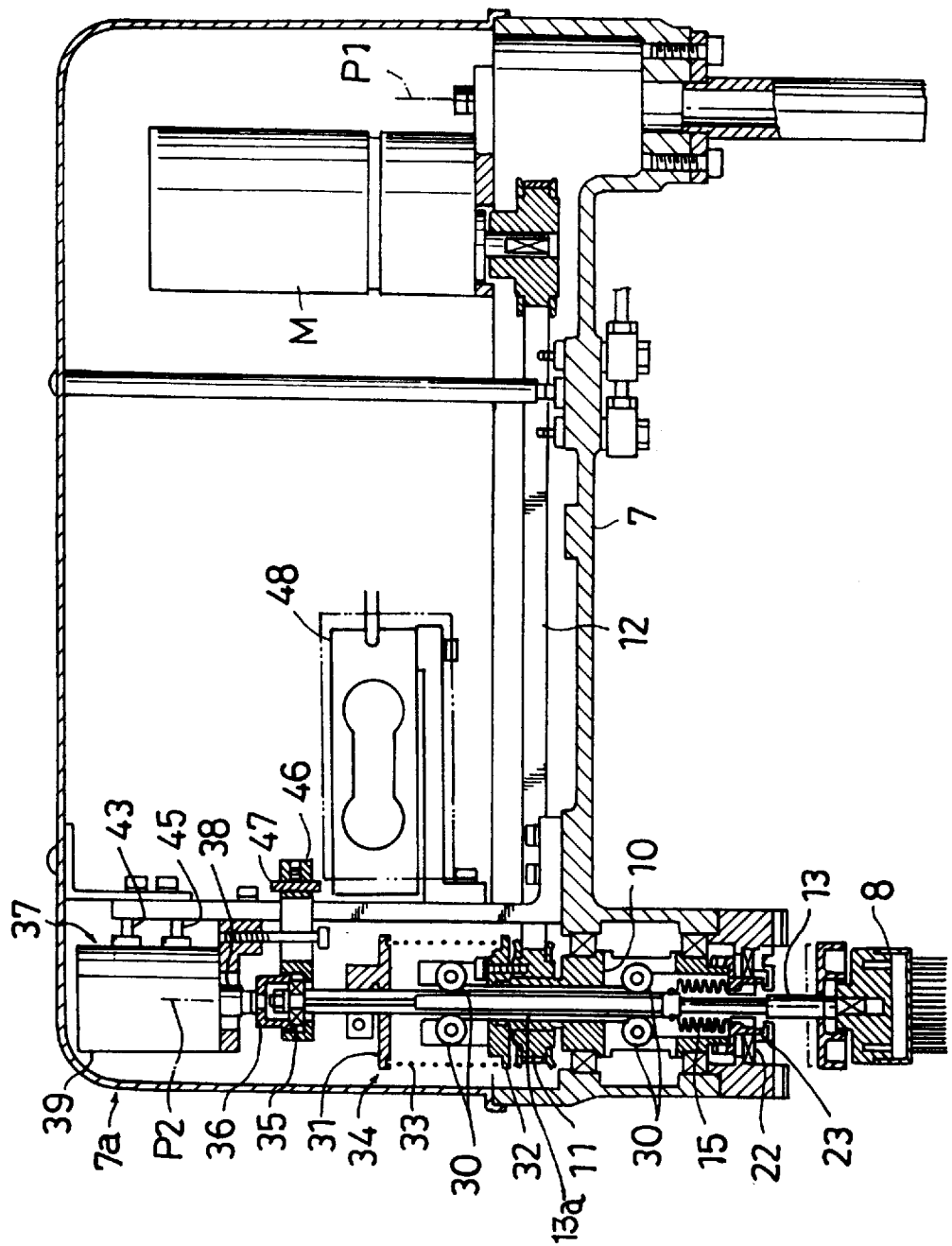
FIG. 7 is an enlarged view in vertical section of substrate spin cleaning apparatus constructed according to a principal portion of a fourth embodiment.

FIG. 7 is an enlarged view in vertical section of a principal portion of a fifth embodiment. This embodiment differs from the first embodiment in the following respects.

A support arm 7 pivotable about a first axis P1 includes a forward arm portion 7a having a rotary element 10 mounted therein to be rotatable about a second axis P2. The rotary element 10 supports a pulley 11 mounted thereon to be rotatable together and operatively connected through a timing belt 12 to a motor M. The rotary element 10 includes two pairs of guide rollers 30 opposed to each other across the pulley 11. The guide rollers 30 act on splines 13a formed on an intermediate portion of a cleaner support 13. These guide rollers 30 are rotatable with the rotary element 10 to allow the cleaner support 13 to move vertically with little resistance. The bellows 15 is mounted, for preventing dust produced by relative sliding movement between the rotary element 10 and the splines 13a from falling to the wafer W, and for preventing the cleaning liquid from entering arm portion 7a.

The cleaner support 13 has a spring seat 31 attached to be rotatable therewith. The rotary element 10 has a spring seat 32 attached thereto. A compression coil spring 33 is mounted between the spring seats 31 and 32. Thus, a weight balancing device 34 is provided to balance the weight of cleaning brush 8 and cleaner support 13, thereby to maintain the cleaning brush 8 at a predetermined height relative to the forward arm portion 7a.

The cleaner support 13 has a contact element 36 mounted on the upper end thereof only to be rotatable relative thereto through a bearing 35. The forward arm portion 7a supports an air cylinder 37 in an upper position thereof opposed to an upper end of the contact element 36 to act as a pressure applying mechanism. The air cylinder 37 includes a cylinder rod 38 having a lower end thereof contacting the contact element 36.

Figure 8:
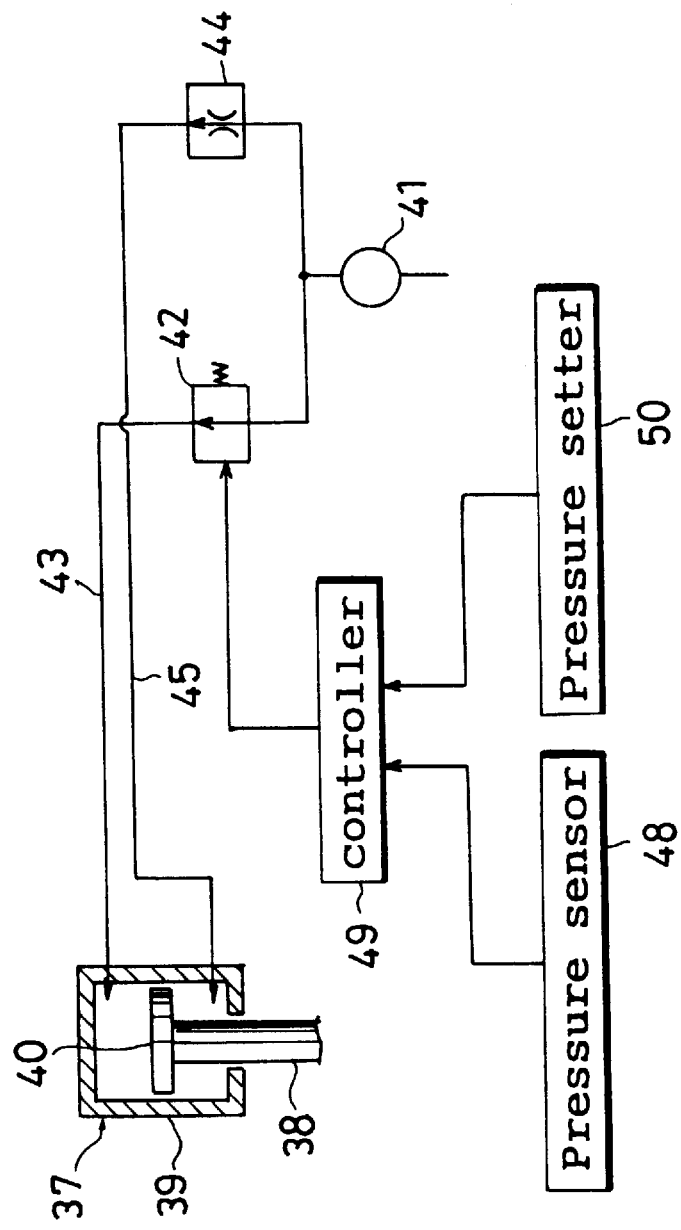
FIG. 8 is a schematic which illustrates a concept of the fourth embodiment.

As shown in FIG. 8, the air cylinder 37 has slight gaps between inner peripheries of a casing 39 and outer peripheries of a piston 40 and cylinder rod 38. A space defined by the casing 39 and piston 40 and remote from the cylinder rod 38 is connected to a compressor 41 through a first air piping 43 having a relief valve 42 to which a relief pressure may be set. A space defined by the casing 39 and piston 40 and surrounding the cylinder rod 38 is connected to the compressor 41 through a second air piping 45 having a metering valve 44. These components constitute a pressurizing device for extending and contracting the air cylinder 37, while centering the air cylinder 37, with air supplied thereto in friction-free condition with little resistance.

The weight balancing device 34 including the spring seats 31 and 32 and compression coil spring 33, and the air cylinder 37, have respective centers thereof concurring with the center of rotation P2 of the cleaning brush 8 in plan view.

As shown in FIG. 7, a sensor arm 46 is rigidly attached to the contact element 36. The sensor arm 46 is allowed to move only vertically by vertical walls of the support arm 7. The sensor arm 46 has a screw 47 attached to a distal end thereof. The support arm 7 includes a distortion gauge type pressure sensor 48 mounted in a predetermined position thereof for contacting the screw 47 when the latter is lowered.

As shown in FIG. 8, a controller 49 is connected to the relief valve 42. The pressure sensor 48 and a pressure setter 50 are connected to the controller 49.

According to the above construction, the pressure setter 50 is operated prior to cleaning of wafer W to input an appropriate cleaning pressure according to the type of layer formed on the wafer W (e.g. aluminum, oxide, nitride, polysilicon, patterned or bare silicon) and the property or type of contaminant adhering the wafer W. Next, the controller 49 is operated to open the relief valve 42, with the cleaning brush 8 retracted from the wafer W. A pressure detected by the pressure sensor 48 is inputted to the controller 49. The controller 49 compares the pressure detected with the pressure set through the pressure setter 50. The controller 49 stores a relief pressure of the relief valve 42 operative at a point of time when the detected pressure equals the set pressure. When, subsequently, the cleaning brush 8 is placed on the wafer W to start cleaning, initial setting is effected to maintain the relief valve 42 at the relief pressure stored. Consequently, wafer W is cleaned while receiving a pressing force corresponding the set pressure regardless of warping of the wafer W.

A magnetic fluid seal 22 and a labyrinth 23 are disposed between lower positions of the forward arm portion 7a and rotary element 10. These components prevent dust produced by wear of the bearings 9 disposed above from falling to the wafer W, and also prevent entry of the cleaning liquid. The other details of this embodiment are the same as in the first embodiment, and like reference numerals are used to identify like parts which will not be described again.

(Fifth Embodiment)

Figure 9:
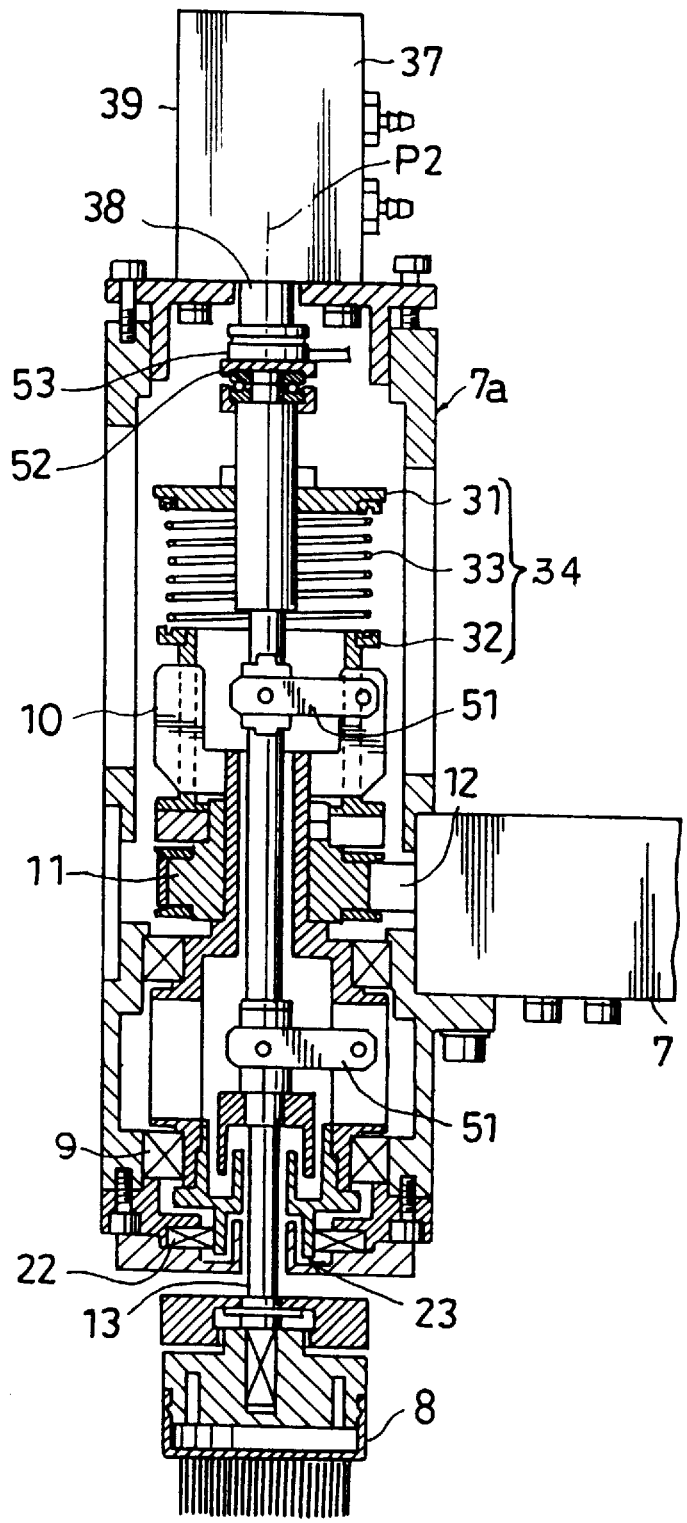
FIG. 9 is an enlarged view in vertical section of a principal portion of substrate spin cleaning apparatus constructed according to a fifth embodiment.
Figure 10:
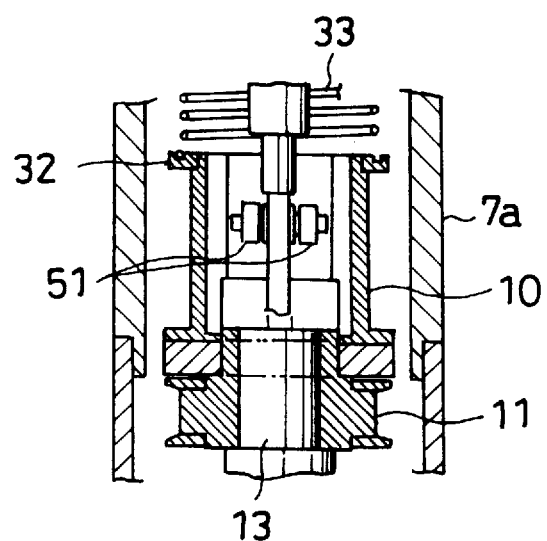
FIG. 10 is a sectioned side view of a portion of the apparatus shown in FIG. 9.
Figure 11:
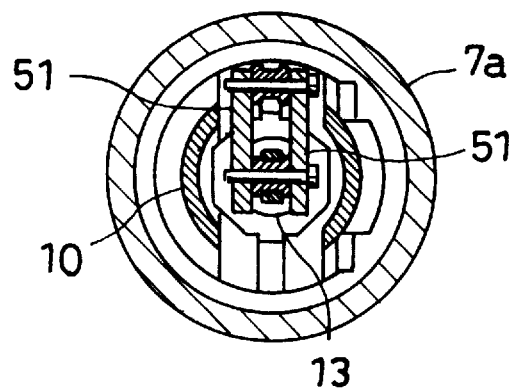
FIG. 11 is a horizontal cross section of a portion of the apparatus shown in FIG. 9.

FIG. 9 is an enlarged view in vertical section of a principal portion of a fifth embodiment. FIG. 10 is a sectional side view and FIG. 11 a transverse cross section thereof. This embodiment differs from the fourth embodiment in the following respects.

The cleaner support 13 and rotary element 10, in combination with upper and lower pairs of links 51, form a parallelogram link mechanism. The cleaner support 13 has a contact element 52 relatively rotatably mounted on the upper end thereof for contacting the cylinder rod 38 through a load cell type pressure sensor 53. The center of pressure sensor 53 concurs with the center of rotation P2 of cleaning brush 8 in plan view. The other details of this embodiment are the same as in the fourth embodiment, and like reference numerals are used to identify like parts which will not be described again.

For initial setting of a pressing force in the fifth embodiment, a relief pressure required for obtaining the set pressure is determined by pressing the cleaning brush 8 upon wafer W to be cleaned. Thus, the fifth embodiment provides the advantage of setting a relief pressure with high precision based on actual cleaning of wafer W.

The compression coil spring 33 used in the fourth and fifth embodiments may be replaced by a nonlinear spring having a fixed resilience regardless of the degree of elastic deformation.

(Sixth Embodiment)

Figure 12:
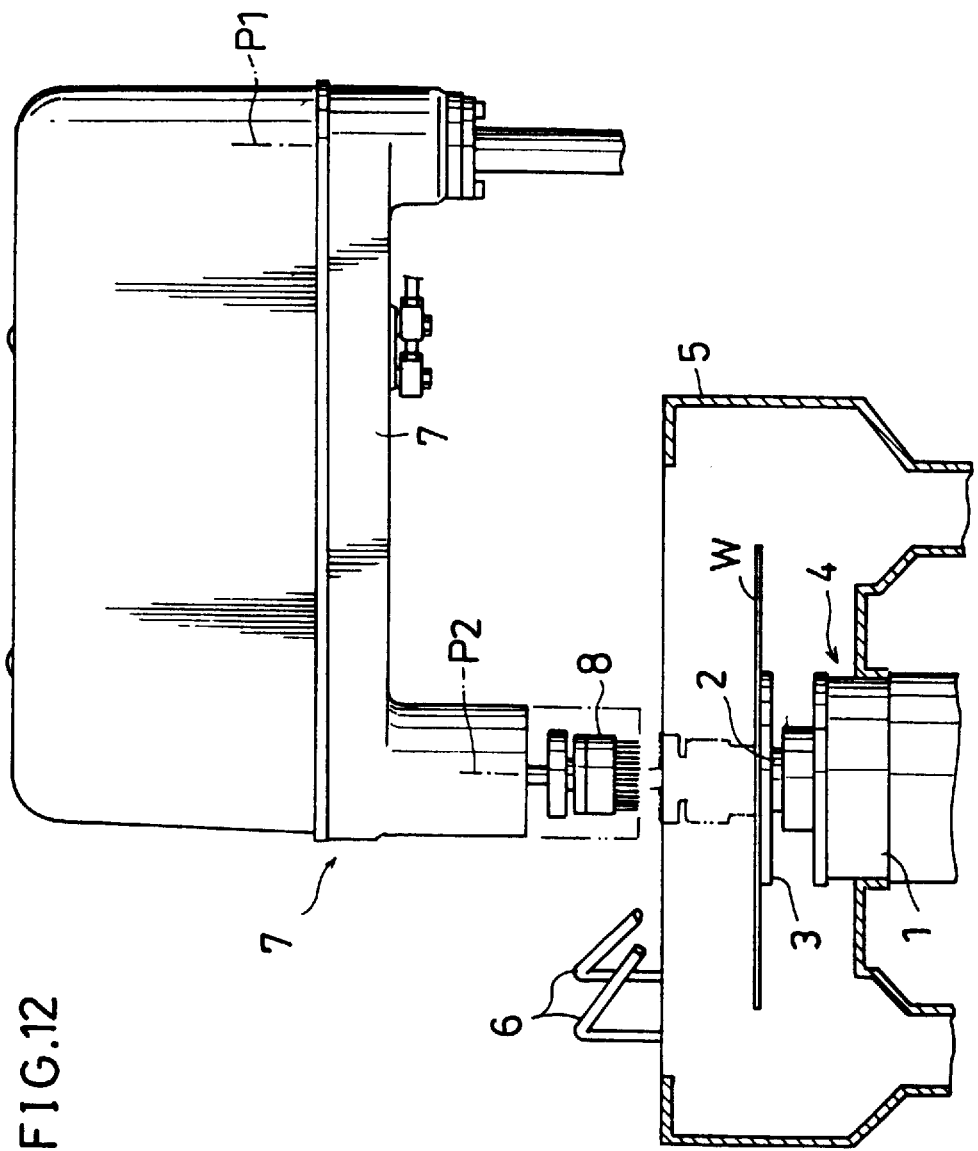
FIG. 12 is a schematic view in vertical section of substrate spin cleaning apparatus constructed according to a sixth embodiment.
Figure 13:
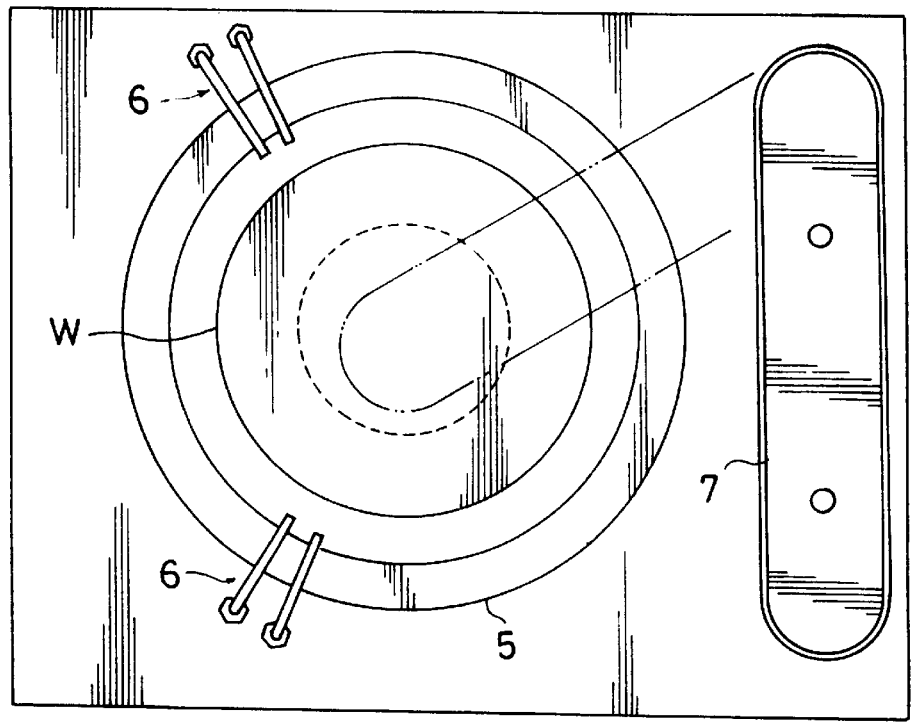
FIG. 13 is a plan view of the sixth embodiment.

FIG. 12 is a schematic view in vertical section of a sixth embodiment. FIG. 13 is a plan view thereof. FIG. 14 is an enlarged view in vertical section of a principal portion of the sixth embodiment. This embodiment differs from the fourth embodiment in the following respects.

The cleaner support 13 has a contact element 36 mounted on the upper end thereof only to be rotatable relative thereto through a bearing 35. The forward arm portion 7a supports an air cylinder 37 in an upper position thereof opposed to an upper end of the contact element 36 to act as a pressuring device for receiving a reaction from the wafer W during a cleaning operation, and supporting the cleaning brush 8 to be vertically movable relative to the wafer W. The air cylinder 37 includes a cylinder rod 38 having a lower end thereof contacting the contact element 36 through a pressure sensor 54.

As shown in FIG. 15, the air cylinder 37 has slight gaps between inner peripheries of a casing 39 and outer peripheries of a piston 40 and cylinder rod 38. A space defined by the casing 39 and piston 40 and remote from the cylinder rod 38 is connected to a compressor 55 through a third air piping 57 having a flow control valve 56. A space defined by the casing 39 and piston 40 and surrounding the cylinder rod 38 is connected to the compressor 55 through a fourth air piping 59 having a metering valve 58. These components extend and contract the air cylinder 37, while centering the air cylinder 37, with air supplied thereto in essentially friction-free condition.

The weight balancing device 34 including the spring seats 31 and 32 and compression coil spring 33, and the air cylinder 37, have respective centers thereof concurring with the center of rotation P2 of the cleaning brush 8 in plan view.

As shown in FIG. 15, the flow control valve 56 has a driver 60 to which a controller 61 is connected. The pressure sensor 54 and a pressure setter 62 are connected to the controller 61 The latter includes a first comparator 63, a second comparator 64, an open signal output 65 and a close signal output 66.

The first comparator 63 receives a pressure detected by the pressure sensor 54 and a pressure set through the pressure setter 62, compares the pressure detected with a lower limit set pressure obtained by subtracting a small value from the set pressure, and outputs a command to the open signal output 65 when the detected pressure is lower than the lower limit set pressure. Then, the open signal output 65 outputs an open signal to the driver 60 to open the flow control valve 56, thereby to increase an operating pressure applied to the air cylinder 37.

The second comparator 64 receives the pressure detected by the pressure sensor 54 and the pressure set through the pressure setter 62, compares the pressure detected with an upper limit set pressure obtained by adding a small value to the set pressure, and outputs a command to the close signal output 66 when the detected pressure exceeds the upper limit set pressure. Then, the close signal output 66 outputs a close signal to the driver 60 to close the flow control valve 56, thereby to reduce the operating pressure applied to the air cylinder 37.

According to the above construction, the pressure setter 62 is operated prior to cleaning of wafer W to input an appropriate cleaning pressure according to the type of layer formed on the wafer W (e.g. aluminum, oxide, nitride, polysilicon, patterned or bare silicon) and the property or type of contaminant adhering the wafer W. When the support arm 7 is moved to a cleaning position to press the cleaning brush 8 upon the wafer W in a spin, the pressure sensor 37 detects a pressure applied from the cleaning brush 8 to the wafer W under cleaning treatment. Based on variations in the detected pressure, the flow control valve 56 is automatically controlled to maintain the pressure applied to the wafer W within the predetermined range between the upper limit set pressure and lower limit set pressure. The other details of this embodiment are the same as in the fourth embodiment, and like reference numerals are used to identify like parts which will not be described again.

(Seventh Embodiment)

Figure 16:
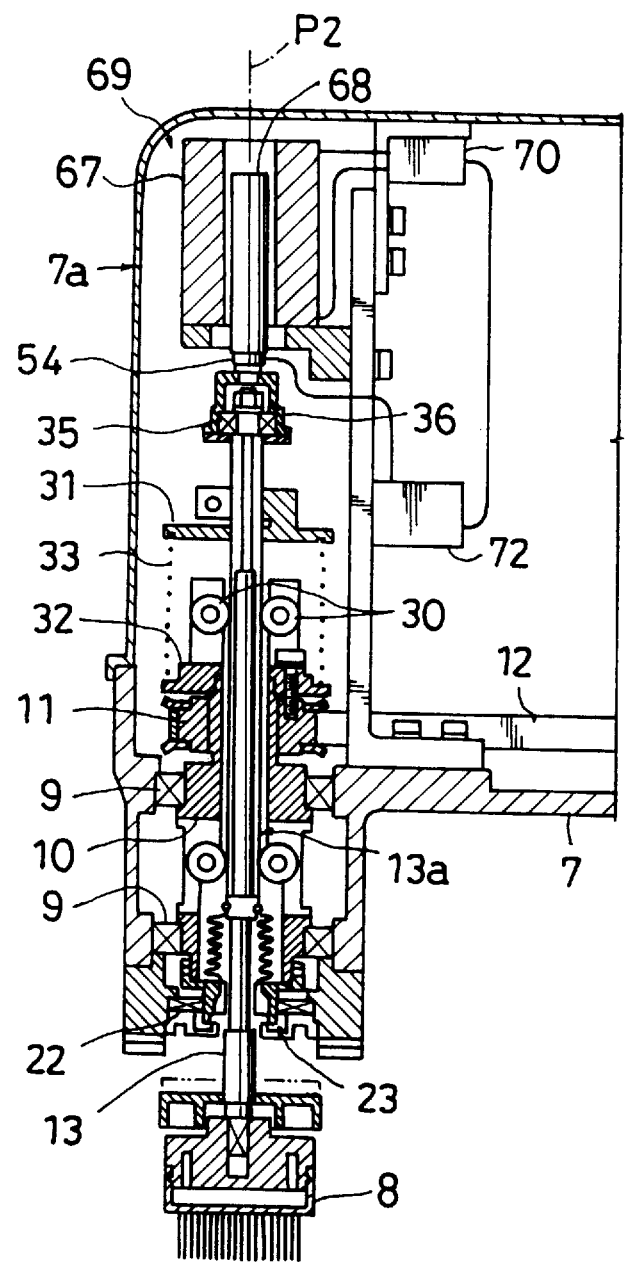
FIG. 16 is an enlarged view in vertical section of a principal portion of substrate spin cleaning apparatus constructed according to a seventh embodiment.

FIG. 16 is an enlarged view in vertical section of a principal portion of a seventh embodiment. This embodiment differs from the sixth embodiment in the following respects.

The forward arm portion 7a includes, in place of the air cylinder 37, a linear actuator 69 and a power supplying device 70, the linear actuator 69 having a coil 67, and a control rod 68 linearly movable through the coil 67.

Figure 17:
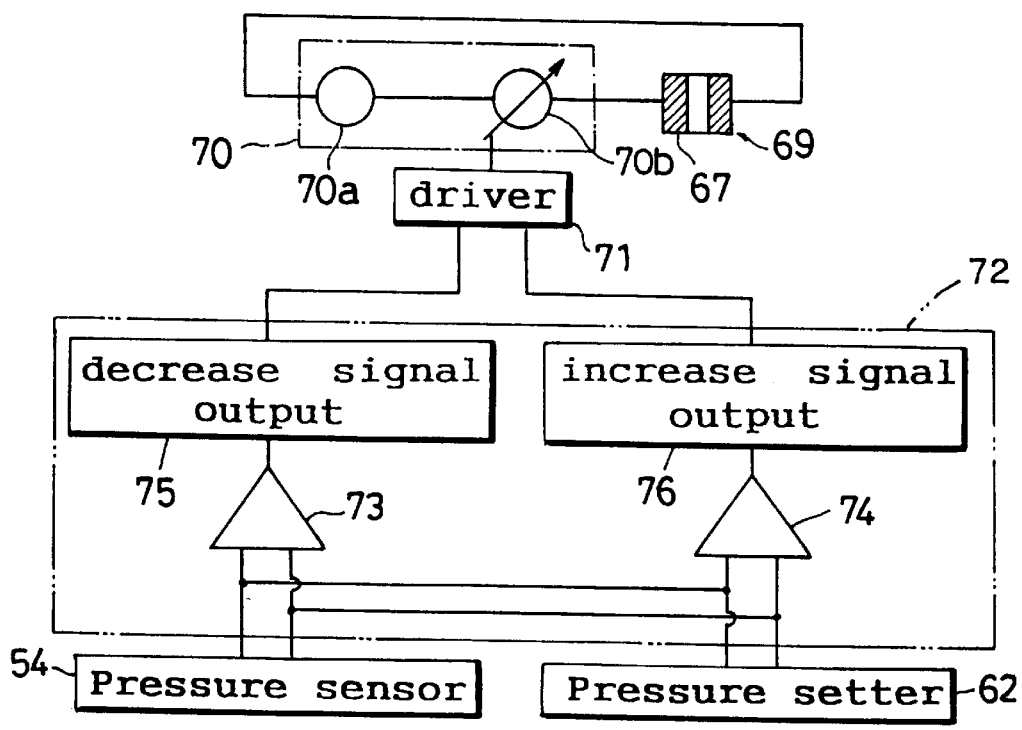
FIG. 17 is a block diagram of a control system in the seventh embodiment.

As shown in FIG. 17, the power supplying device 70 includes a power source 70a and a variable resistor 70b. The variable resistor 70*b* has an adjustable resistance to vary an electric current supplied to the coil 67, thereby to control an electromagnetic force of the linear actuator 69.

The variable resistor 70*b* has a driver 71 to which a controller 72 is connected. The pressure sensor 54 and pressure setter 62 are connected to the controller 61. As in the sixth embodiment, the pressure sensor 54 is disposed between the control rod 68 and cleaner support 13.

The controller 72 includes a first comparator 74, a second comparator 73, a decrease signal output 75 and an increase signal output 76.

The first comparator 74 receives a pressure detected by the pressure sensor 54 and a pressure set through the pressure setter 62, compares the pressure detected with a lower limit set pressure obtained by subtracting a small value from the set pressure, and outputs a command to the increase signal output 76 when the detected pressure is lower than the lower limit set pressure. Then, the increase signal output 76 outputs an increase signal to the driver 71 to increase the electromagnetic force of the linear actuator 69, thereby to increase the pressure applied from the cleaning brush 8 to the wafer W.

The second comparator 73 receives the pressure detected by the pressure sensor 54 and the pressure set through the pressure setter 62, compares the pressure detected with an upper limit set pressure obtained by adding a small value to the set pressure, and outputs a command to the decrease signal output 75 when the detected pressure exceeds the upper limit set pressure. Then, the decrease signal output 75 outputs a decrease signal to the driver 71 to decrease the electromagnetic force of the linear actuator 69, thereby to decrease the pressure applied from the cleaning brush 8 to the wafer W. The other details of this embodiment are the same as in the sixth embodiment, and like reference numerals are used to identify like parts which will not be described again.

According to the above construction, the pressure sensor 54 detects a pressure applied from the cleaning brush 8 to the wafer W under cleaning treatment. Based on variations in the detected pressure, the electromagnetic force of linear actuator 69 is automatically controlled to maintain the pressure applied to the wafer W within the predetermined range between the upper limit set pressure and lower limit set pressure.

(Eighth Embodiment)

Figure 18:
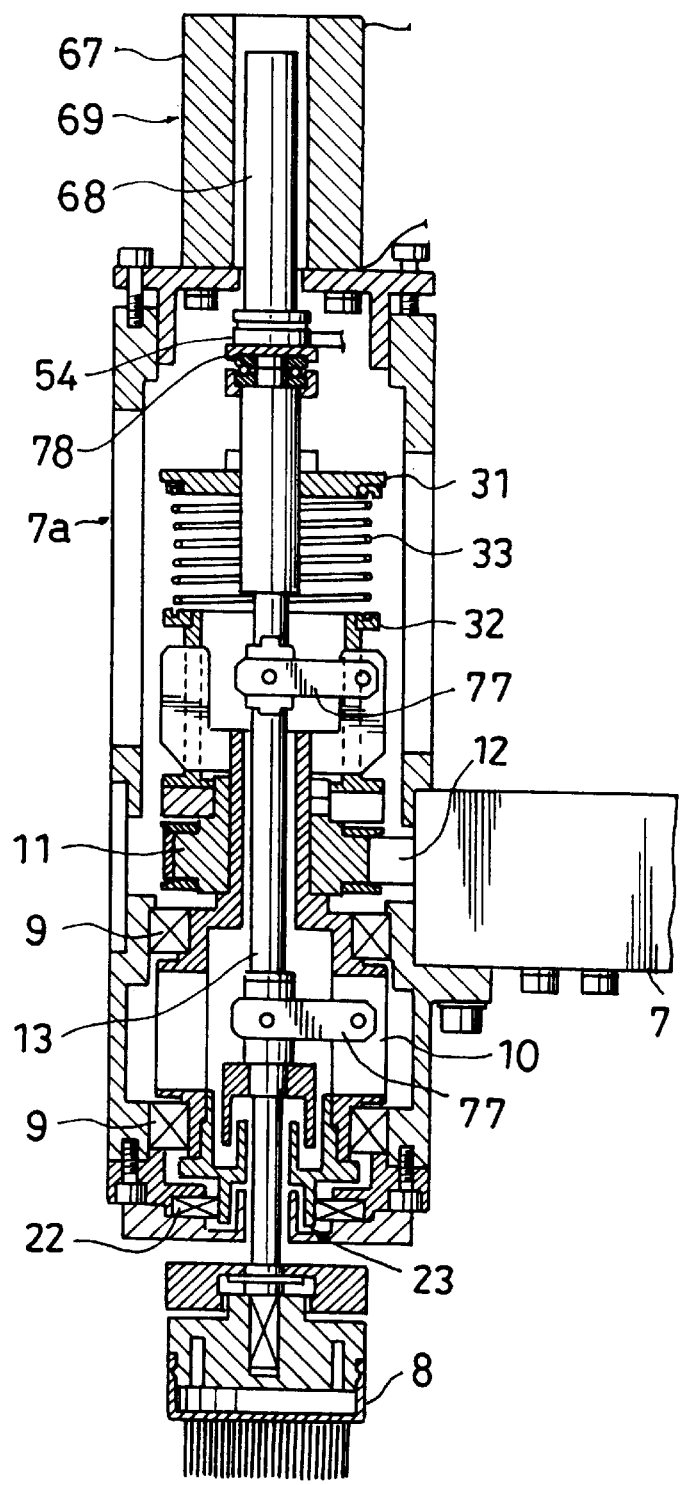
FIG. 18 is an enlarged view in vertical section of a principal portion of substrate spin cleaning apparatus constructed according to an eighth embodiment.

FIG. 18 is an enlarged view in vertical section of a principal portion of an eighth embodiment. This embodiment differs from the seventh embodiment in the following respects.

The cleaner support 13 and rotary element 10, in combination with upper and lower pairs of links 77, form a parallelogram link mechanism. The cleaner support 13 has a contact element 78 relatively rotatably mounted on the upper end thereof for contacting the control rod 68 through a load cell type pressure sensor 54. The center of pressure sensor 54 concurs with the center of rotation P2 of cleaning brush 8 in plan view. The other details of this embodiment are the same as in the seventh embodiment, and like reference numerals are used to identify like parts which will not be described again. The links 77 have the same connection structure as in the fifth embodiment.

In this embodiment, the cleaning brush 8 and cleaner support 13 rigidly connected to each other are vertically movable relative to the rotary element 10. Instead, the combination of cleaning brush 8, cleaner support 13 and rotary element 10 may be adapted to be vertically movable relative to the forward arm portion 7*a* of support arm 7.

(Ninth Embodiment)

Figure 19:
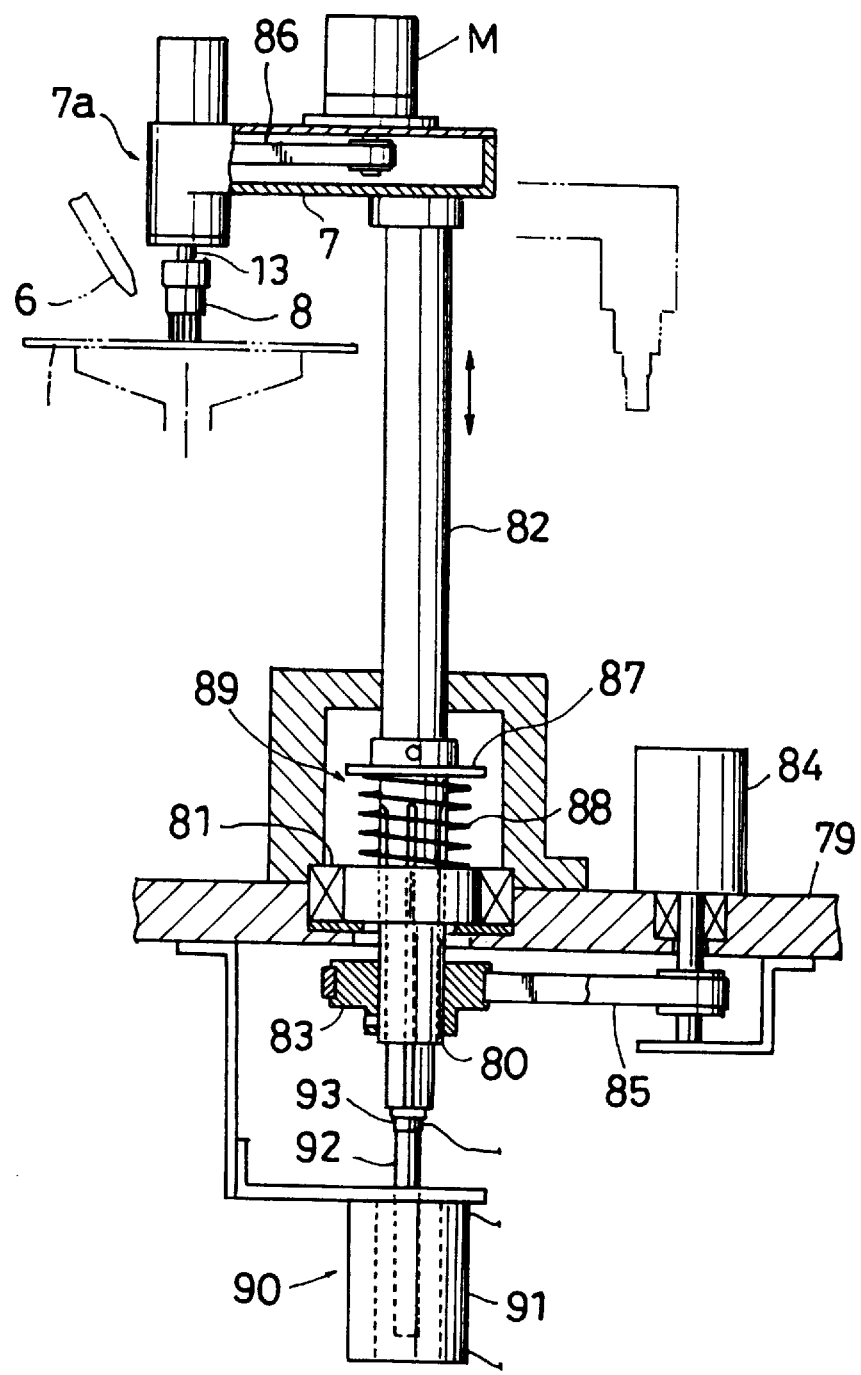
FIG. 19 is a front view, partly in section, of substrate spin cleaning apparatus constructed according to a ninth embodiment.

FIG. 19 is a schematic view in vertical section of a ninth embodiment of the invention. Here, an apparatus frame 79 has a tubular support 80 mounted thereon to be rotatable through a bearing 81. The support arm 7 has a rotary shaft 82 attached to one end thereof and extending through the tubular support 80 only to be vertical movable relative thereto. The tubular support 80 has a pulley 83 fixed thereto and operatively connected to a reversible electric motor 84 through a transmission belt 85.

The support arm 7 has a cleaner support 13 supporting a cleaning brush 8 and attached to the other end thereof only to be rotatable relative thereto. The cleaner support 13 is operatively connected through a belt transmission mechanism 86 to an electric motor M mounted on the support arm 7.

The rotary shaft 82 has a spring seat 87 attached to an intermediate position thereof. A compression coil spring 88 is mounted between the spring seat 87 and tubular support 80 to bias the rotary shaft 82 upward. Thus, a weight balancing device 89 is provided which, with a small supporting force in natural state, maintains the cleaning brush 8 in a cleaning position relative to the wafer W.

A linear actuator 90 is disposed under and opposite a lower end of the rotary shaft 82 to act as a pressing and supporting device. The linear actuator 90 includes a coil 91, and a control rod 92 extending therethrough. The rotary shaft 82 is supported by the control rod 92 through a pressure sensor 93. When a pressure detected by the pressure sensor 93 exceeds a predetermined range, the electromagnetic force of linear actuator 90 is increased to raise the support arm 7. When the pressure detected by the pressure sensor 93 is below the predetermined range, the electromagnetic force of linear actuator 90 is decreased to lower the support arm 7. The pressure applied from the cleaning brush 8 to the wafer W is thereby maintained within the predetermined range. The other details of this embodiment are the same as in the first embodiment.

The compression coil springs 27 and 28 in the foregoing embodiments may be replaced by a nonlinear spring having a fixed resilience irrespective of the degree of elastic deformation.

The present invention may be implemented advantageously where the cleaning brush 8 is a nylon brush or mohair brush, or formed of a soft material such as sponge or felt. However, the invention may employ a plastic brush.

In order to move the cleaning brush 8 horizontally over the surface of wafer W, the support arm 7 is pivotable about the first vertical axis P1 by an electric motor. Instead, the support arm 7 may be adapted to be movable linearly by an air cylinder or the like. The combination of support arm 7 and an electric motor and the combination of support arm 7 and an air cylinder are collectively called herein a cleaner displacing device.

In the above embodiment, the cleaning brush 8 and cleaner support 13, rigidly connected to each other, are vertically movable relative to the rotary element 10. Instead, the combination of cleaning brush 8, cleaner support 13 and rotary element 10 may be adapted to be movable vertically relative to the forward arm portion 7*a* of support arm 7. The combination of cleaning brush 8 and cleaner support 13, and the combination of cleaning brush 8, cleaner support 13 and rotary element 10, are collectively called herein a cleaning device.

The present invention is not limited to the substrate spin cleaning apparatus for cleaning circular substrates as described in the foregoing embodiments, but is applicable also to a substrate spin cleaning apparatus for cleaning square substrates.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate spin cleaning apparatus comprising:
   substrate support means for supporting a substrate and spinning said substrate about a first vertical axis;
   cleaning means for cleaning a surface of said substrate;
   cleaner rotating means for rotating said cleaning means about a second vertical axis;
   cleaner displacing means for displacing said cleaning means horizontally over said surface of said substrate; and
   cleaning liquid supply means for supplying a cleaning liquid to positions of said surface of said substrate under cleaning treatment by said cleaning means;
   said cleaning means being supported by said cleaner displacing means to be movable vertically relative thereto; and
   pressurizing means for moving said cleaning means vertically relative to said substrate under cleaning treatment in response to cleaning pressure exerted by said cleaning means against said surface of said substrate whereby said cleaning pressure is maintained within a predetermined range.

2. A substrate spin cleaning apparatus as defined in claim 1, wherein said pressurizing means includes a pressure applying mechanism for adjustably determining a pressing force of said pressurizing means.

3. A substrate spin cleaning apparatus as defined in claim 2, further comprising a sensor for detecting a pressure applied from said cleaning means to said substrate, said sensor having a center thereof concurring with a center of rotation of said cleaning means in plan view.

4. A substrate spin cleaning apparatus as defined in claim 2 or 3, further comprising:
   a rotary element rotatable by said cleaner rotating means; and
   a cleaner support for rigidly supporting said cleaning means, said cleaner support being movable vertically through action of said pressurizing means.

5. A substrate spin cleaning apparatus as defined in claim 4, wherein said cleaner support is rotatably supported by said cleaner displacing means through bearings, said cleaner support having a magnetic fluid seal disposed below said bearings for preventing particles produced by rotation of said bearings from falling upon a substrate under treatment, and a labyrinth seal for preventing entry of water to said magnetic fluid seal.

6. A substrate spin cleaning apparatus as defined in claim 4, further comprising weight balancing means disposed between said rotary element and said cleaner support means for balancing a weight of said cleaning means to maintain said cleaning means at predetermined height.

7. A substrate spin cleaning apparatus as defined in claim 6, wherein said weight balancing means and said pressure applying mechanism have respective horizontally positioned centers thereof concurring with said center of rotation of said cleaning means in plan view.

8. A substrate spin cleaning apparatus as defined in claim 7, wherein said cleaner support is rotatably supported by said cleaner displacing means through bearings, said cleaner support having a magnetic fluid seal disposed below said bearings for preventing particles produced by rotation of said bearings from falling upon a substrate under treatment, and a labyrinth seal for preventing entry of water to said magnetic fluid seal.

9. A substrate spin cleaning apparatus as defined in claim 1, further comprising:
   a sensor disposed between said cleaning means and said pressurizing means for detecting a pressure applied from said cleaning means to said substrate under cleaning treatment; and
   control means for controlling said pressurizing means to maintain said pressure detected by said sensor within a predetermined range.

10. A substrate spin cleaning apparatus as defined in claim 9, further comprising:
    a rotary element rotatable by said cleaner rotating means; and
    a cleaner support for rigidly supporting said cleaning means;
    said pressurizing means being disposed between said rotary element and said cleaner support for vertically moving said cleaner support.

11. A substrate spin cleaning apparatus as defined in claim 10, wherein said cleaner support is rotatably supported by said cleaner displacing means through bearings, said cleaner support having a magnetic fluid seal disposed below said bearings for preventing falling of particles produced from said bearings, and a labyrinth seal for preventing entry of water to said magnetic fluid seal.

12. A substrate spin cleaning apparatus as defined in claim 10, further comprising weight balancing means disposed between said rotary element and said cleaner support means for balancing weight of said cleaning means to maintain said cleaning means at a predetermined height.

13. A substrate spin cleaning apparatus as defined in claim 12, wherein said weight balancing means, said pressuring means and said pressure sensor have respective centers thereof concurring with a center of rotation of said cleaning means in plan view.

14. A substrate spin cleaning apparatus as defined in claim 13, wherein aid cleaner support is rotatably supported by said cleaner displacing means through bearings, said cleaner support having a magnetic fluid seal disposed below said bearings for preventing particles produced by rotation of said bearings from falling upon a substrate under treatment, and a labyrinth seal for preventing entry of water to said magnetic fluid seal.

15. A substrate spin cleaning apparatus as defined in any one of claims 9 to 14, wherein said pressurizing means comprises a linear actuator using an electro-magnetic force as a drive source.

16. A substrate spin cleaning apparatus as defined in claim 1, further comprising:
    pressing and supporting means connecting said cleaner displacing means to an apparatus frame while permitting relative vertical movement therebetween;
    a pressure sensor for detecting pressure applied from said cleaning means to said substrate under cleaning treatment; and
    control means for controlling said pressing and supporting means to maintain said pressure detected by said pressure sensor within a predetermined range.

17. A substrate spin cleaning apparatus as defined in claim 16, wherein said pressing and supporting means comprises a linear actuator using an electromagnetic force as a drive source.

* * * * *